United States Patent

Kwon

[11] Patent Number: 6,067,264
[45] Date of Patent: May 23, 2000

[54] HIGH SPEED SEMICONDUCTOR MEMORY DEVICE

[75] Inventor: Kook-hwan Kwon, Kunggi-do, Rep. of Korea

[73] Assignee: Samsung Electronics, Co., Ltd., Suwon, Rep. of Korea

[21] Appl. No.: 09/085,185

[22] Filed: May 26, 1998

[30] Foreign Application Priority Data

May 24, 1997 [KR] Rep. of Korea ...................... 97-20508

[51] Int. Cl.⁷ .................................................. G11C 7/00

[52] U.S. Cl. ............... 365/203; 365/230.06; 365/189.11; 365/185.25

[58] Field of Search .............................. 365/189.11, 203, 365/185.25, 230.06

[56] References Cited

U.S. PATENT DOCUMENTS

| | | | |
|---|---|---|---|
| 4,510,584 | 4/1985 | Dias et al. | 365/203 |
| 4,635,229 | 1/1987 | Okumura et al. | 365/154 |
| 4,733,112 | 3/1988 | Yamaguchi | 307/530 |
| 5,761,123 | 6/1998 | Kim et al. | 365/185.21 |

*Primary Examiner*—David Nelms
*Assistant Examiner*—Tuan T. Nguyen
*Attorney, Agent, or Firm*—Marger Johnson & McCollom, P.C.

[57] ABSTRACT

Disclosed is a high speed semiconductor memory device, which includes a memory cell to which a pair of bit lines are coupled and a discharge circuit for sufficiently discharging one of the bit lines which is being pulled down to a low voltage level in a write operation. Thus, in spite of a short write cycle time, the write operation speed of the memory can be improved without the imperfection in writing a data into the memory cell.

12 Claims, 3 Drawing Sheets

HIGH SPEED SEMICONDUCTOR MEMORY DEVICE

FIELD OF THE INVENTION

The present invention relates to semiconductor memories and, more particularly, to high speed semiconductor static random access memories capable of carrying out write operations with stability.

BACKGROUND OF THE INVENTION

For recent high speed semiconductor memory devices, specifically, synchronous memories, their cycle time tends to be determined by not their read cycle time but their write cycle time, since the write operation should be completed in a short write cycle and the margin between cell select signals and a write pulse signal should be assured.

FIG. 1 illustrates a prior art semiconductor memory device. Reference numeral 100 represents an array of memory cells, 110 a bit line load and equalizing circuit formed by bit line load transistors 1 and 2 and a bit line equalizing transistor 3, 120 a sense amplifier, 130 a data output buffer, 140 a data input buffer, 150 a write driver, and 160 a column pass gate circuit formed by column pass gate transistors 4A, 5A, 4B and 5B.

Also, reference symbol WL1, WL2, . . . , WLn designate word lines, BL and $\overline{BL}$ (The $\overline{BL}$ represents an inverted BL) an a pair of bit lines, and DL and $\overline{DL}$ (The $\overline{DL}$ represents an inverted DL) a pair of data lines.

In the prior art semiconductor memory device, when a pulse signal $\overline{PWR}$ (i.e, write recovery control signal) is activated, the bit lines BL and $\overline{BL}$ both are precharged to a predetermined voltage level.

In such a pecharge state, if one of the word lines WL1 to WLn is selected by a row select signal (not shown), further, if column select signals Yi and $\overline{Yi}$ (The $\overline{Yi}$ represents an inverted Yi) and a write pulse signal PWB (not shown) are activated, then one of the data lines DL and $\overline{DL}$ is pulled down to a low level (usually, ground voltage) by the write driver 150 such that a corresponding bit line BL or $\overline{BL}$ is also pulled down to the low voltage level by means of charge sharing with the corresponding data line DL or $\overline{DL}$ via the column gate circuit 160. At this time, the other bit line is pulled up to a high voltage level (usually, power supply voltage). In this manner, a data is written into a memory cell.

By the write recovery control signal $\overline{PWR}$, the memory device is made to be ready for the next write cycle such that the bit lines BL and $\overline{BL}$ both are brought back into the precharge state again.

As reduced is the write cycle time, however, the width of the write pulse signal PWB has also to be shorten on account of inter-cycle margin, resulting in the imperfection in writing a data into a memory cell since the write operation has been completed before a pertinent bit line is sufficiently pulled down to a low voltage level, thereby increasing the possibility of a malfunction of the memory device so as to prevent the high speed write operation.

SUMMARY OF THE INVENTION

It is therefore an object of the present invention to provide a semiconductor memory device which capable of speeding up its write operation and preventing its malfunction in spite of a short write cycle time.

According to the present invention, the problems in the prior art are solved by more sufficiently pulling the bit line level down to a low level compared to the above-described prior art semiconductor memory in a short write cycle.

According to an aspect of the invention, there is provided a semiconductor memory device comprising a memory cell to which a word line and a pair of bit lines are coupled and a discharge circuit responsive a discharge control signal, for discharging one of the bit lines which is being pulled down to a low voltage level in a write operation.

The discharge circuit provides a discharge current path between the bit line being pulled down and ground voltage in response to the discharge control signal. The discharge circuit includes two current drive transistors having current paths respectively coupled to the bit lines and control terminals cross-coupled to the bit lines, and at least one switching transistor coupled between the current drive transistors and the ground voltage and being turned on/off in response to the discharge control signal. In the memory device, the column select signal may be used as the discharge control signal. The memory device may be a synchronous static or dynamic random access memory.

BRIEF DESCRIPTION OF THE DRAWINGS

The present invention will be described by way of exemplary embodiment, but not limitations, illustrated in the accompanying drawings in which like references denote similar elements, and in which.

DESCRIPTION OF THE PREFERRED EMBODIMENT

A preferred embodiment of the present invention will now be described with reference to the accompanying drawings in detail. In the following description, well-known circuits are shown in block diagram form in order not to obscure the present invention.

Figure 2:
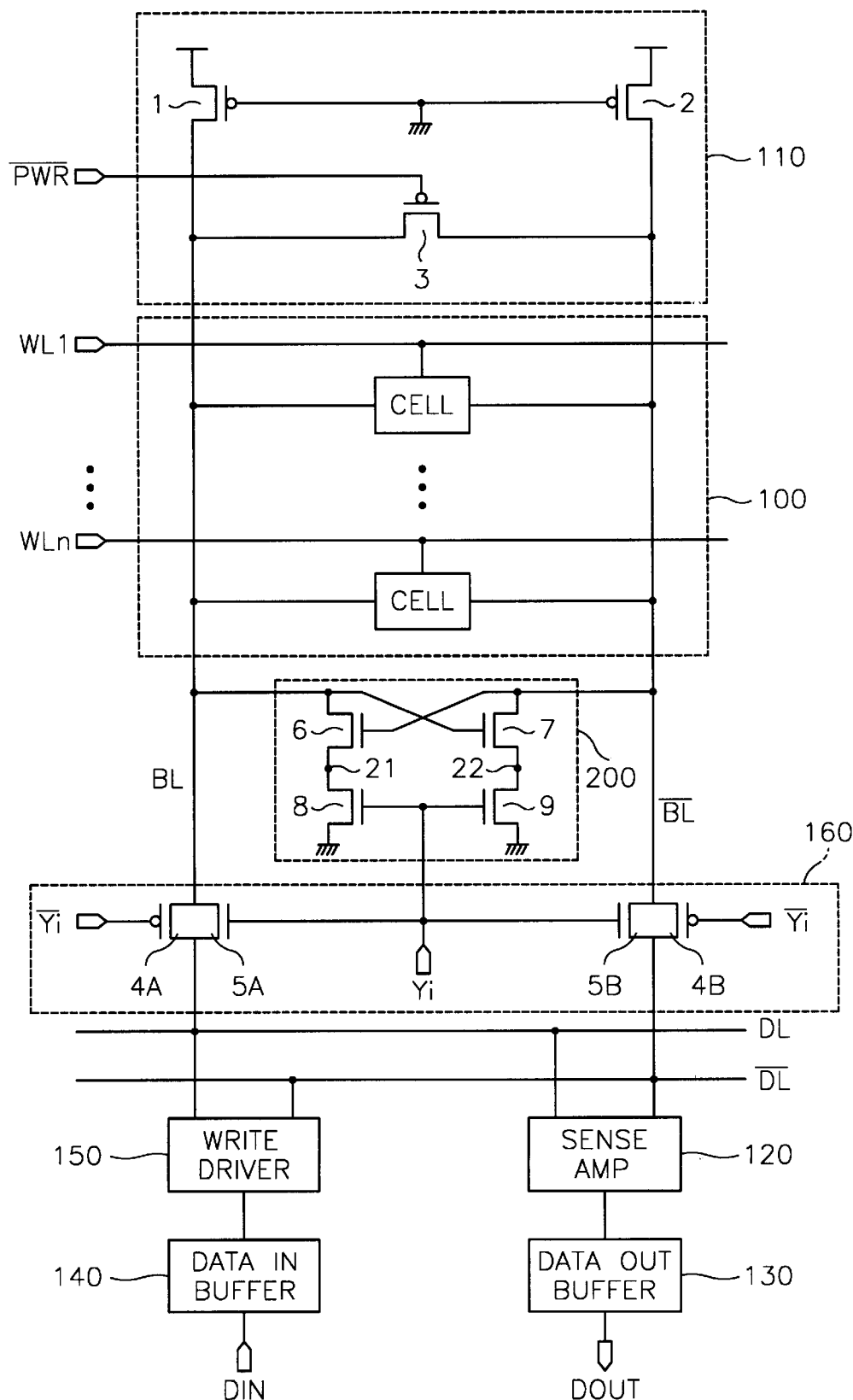
FIG. 2 is a circuit diagram illustrating an embodiment of a semiconductor memory device according to the present invention.

FIG. 2 is a circuit diagram illustrating a preferred embodiment of a semiconductor memory device according to the present invention.

In FIG. 2, reference numeral 100 represents an array of memory cells, 110 a bit line load and equalizing circuit formed by bit line load transistors 1 and 2 and a bit line equalizing transistor 3, 120 a sense amplifier, 130 a data output buffer, 140 a data input buffer, 150 a write driver, and 160 a column pass gate circuit formed by column pass gate transistors 4A, 5A, 4B and 5B. Reference symbol WL1, WL2, . . . , WLn designate word lines, BL and $\overline{BL}$ (The $\overline{BL}$ represents an inverted BL) an a pair of bit lines, and DL and $\overline{DL}$ (The $\overline{DL}$ represents an inverted DL) a pair of data lines. The column pass gate circuit 160 electrically connects/disconnects the data line pair with/from the bit line pair in response to a column select signal.

Reference numeral 200 designates a discharge circuit, in response to a column select signal Yi which functions as a discharge control signal, for discharging one of the bit lines BL and $\overline{BL}$ which is being pulled down to a low voltage level in a write operation. The discharge circuit 200 includes metal oxide semiconductor (MOS) field effect transistors 6 through 9. The MOS transistors 6 through 9 provide a discharge current path between the pulled-down bit line BL or $\overline{BL}$ and ground voltage in response to the column select signal Yi. The current paths of the current drive transistors 6 and 7 are coupled to the bit lines BL and $\overline{BL}$, respectively, and the control terminals (i.e., gates) thereof are cross-coupled to the bit lines BL and $\overline{BL}$. The switching transistors 8 and 9 coupled between the current drive transistors 6 and 7 and the ground voltage are turned on/off in response to the column select signal Yi.

In this embodiment, when a pulse signal $\overline{PWR}$ (i.e, write recovery control signal) is activated, the bit lines BL and $\overline{BL}$ both are precharged to a predetermined voltage level (e.g., half of power supply voltage) and equalized by the equalizing transistor 3.

In such a pecharge state, if one of the word lines WL1 to WLn is selected by a row select signal (not shown), further, if column select signals Yi and $\overline{Yi}$ (The $\overline{Yi}$ represents an inverted Yi) and a write pulse signal PWB (not shown) become activated, then one of the data lines DL and $\overline{DL}$ starts to be pulled down to a low level (usually, ground voltage) by the write driver 150 such that a corresponding bit line BL or $\overline{BL}$ also begins to be pulled down to the low voltage level by means of charge sharing with the corresponding data line DL or $\overline{DL}$ via the column gate circuit 160. At the same time, the switching transistors 8 and 9 within the discharge circuit 200 are turned in response to the column select signal Yi. A discharge current path is thus provided for the bit line being pulled down to the low level such that the bit line is discharged more quickly and sufficiently in a short write cycle, compared to the prior art semiconductor memory. At this time, the other bit line is pulled up to a high voltage level (usually, power supply voltage). In this manner, a data is written into a memory cell.

By the write recovery control signal $\overline{PWR}$, the memory device according to this embodiment is made to be ready for the next write cycle such that the bit lines BL and $\overline{BL}$ both are brought back into the precharge state again.

Figure 1:
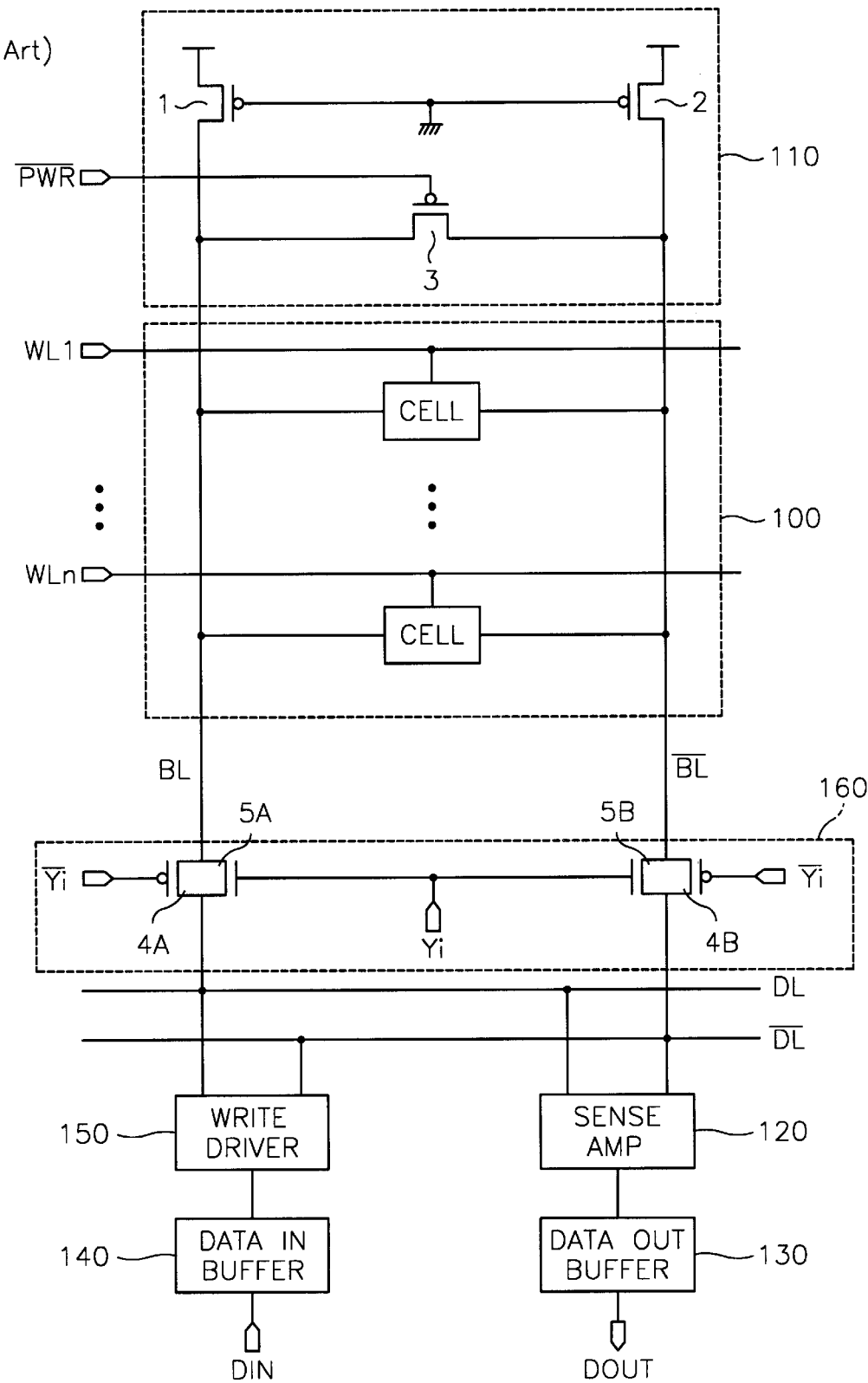
FIG. 1 is a circuit diagram illustrating a prior art semiconductor memory device.
Figure 3:
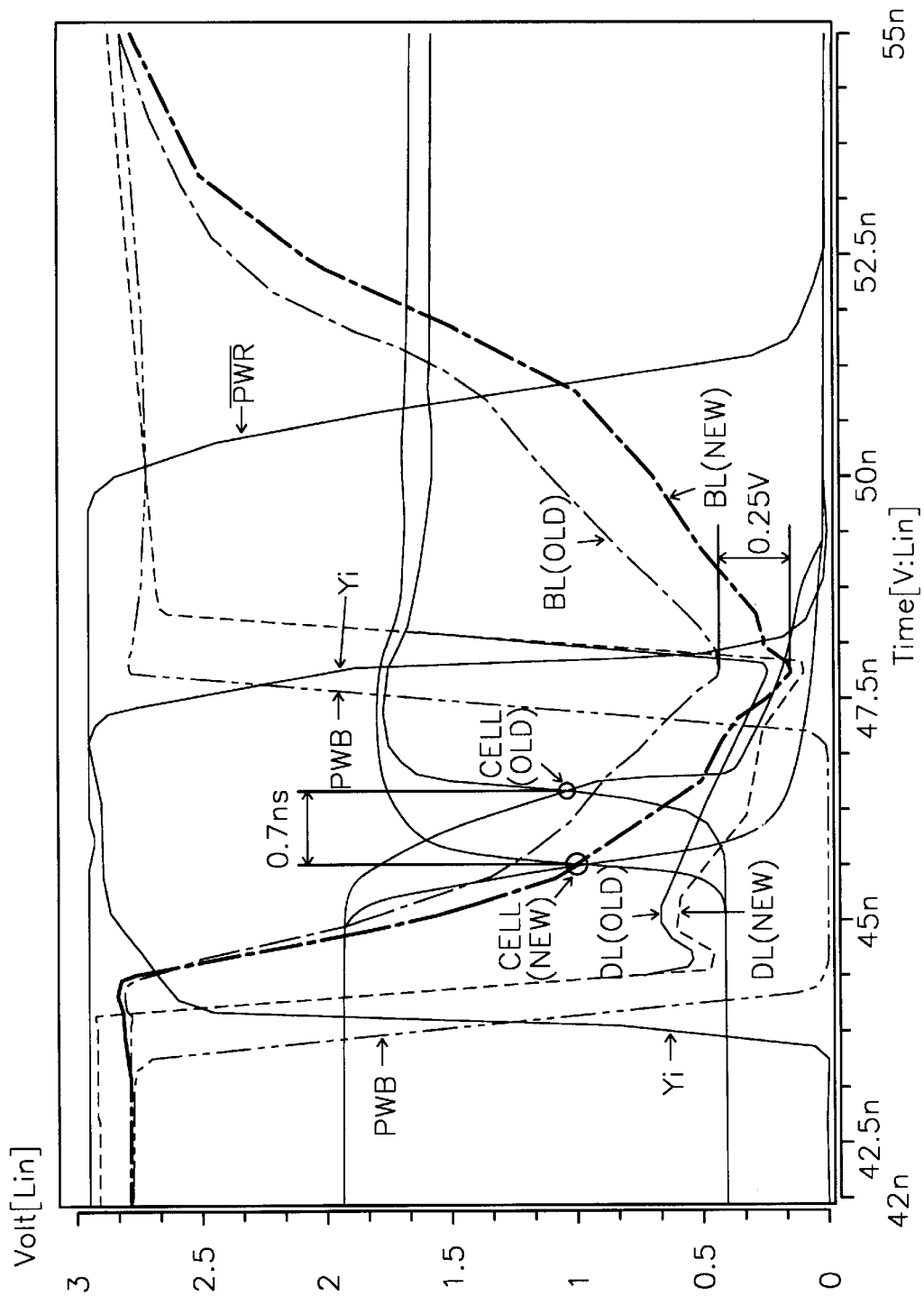
FIG. 3 is a timing diagram illustrating the operations of the devices of FIGS. 1 and 2.

FIG. 3 is a timing diagram illustrating the operation of the semiconductor memory device of FIG. 2, compared to that of the prior art semiconductor memory device shown in FIG. 1. In reference characters, "OLD" and "NEW" designate the prior art semiconductor memory and the semiconductor memory device according to this embodiment, respectively. As can be seen in FIG. 3, the bit line potential BL(NEW) of this embodiment is lower than that BL(OLD) of the prior art memory by about 0.25 volts. In addition, the bit line transition time CELL (NEW) of this embodiment is faster than that CELL(OLD) of the prior art memory by about 0.7 ns.

As described above, since the high speed semiconductor memory device of the invention includes a discharge circuit for sufficiently discharging one of the bit lines, which is being pulled down to a low voltage level in a write operation, in spite of a short write cycle time, whereby the write operation speed of the memory device of the invention can be improved without the imperfection in writing data into memory cells.

Although the preferred embodiment of the present invention has been disclosed for illustrative purposes, those skilled in the art will appreciate that various modifications, additions and substitutions are possible, without departing from the scope and spirit of the invention as described in the accompanying claims.

What is claimed is:

1. A semiconductor memory device comprising:
   a memory cell;
   a word line coupled to said memory cell;
   a pair of bit lines coupled to said memory cell;
   a pair of data lines coupled to a write driver for writing data into said memory cell and to a sense amplifier for sensing data from said memory cell;
   a column pass gate coupled between said bit line pair and said data line pair, for electrically connecting/disconnecting said data line pair with/from said bit line pair in response to a column select signal; and
   a discharge circuit responsive to a discharge control signal, for discharging one of said bit lines which is being pulled down to a low voltage level in a write operation.

2. The memory device according to claim 1, wherein said discharge circuit provides a discharge current path between said bit line being pulled down and ground voltage in response to the discharge control signal, wherein said discharge circuit includes two current drive transistors having current paths respectively coupled to said bit lines and control terminals cross-coupled to said bit lines, and at least one switching transistor coupled between said current drive transistors and the ground voltage and being turned on/off in response to the discharge control signal.

3. The memory device according to claim 1, wherein said column select signal is used as said discharge control signal.

4. A semiconductor memory device comprising:
   a memory cell;
   a word line coupled to said memory cell;
   a pair of bit lines coupled to said memory cell;
   a pair of data lines coupled to a write driver for writing data into said memory cell and to a sense amplifier for sensing data from said memory cell;
   a column pass gate coupled between said bit line pair and said data line pair, for electrically connecting/disconnecting said data line pair with/from said bit line pair in response to a column select signal; and
   a discharge circuit responsive to a discharge control signal, for discharging one of said bit lines which is being pulled down to a low voltage level in a write operation;
   wherein said discharge circuit comprises a first MOS transistor having a current path coupled to a first one of said bit lines and a gate coupled to a second of said bit lines, a second MOS transistor having a current path coupled to said second bit line and a gate coupled to said first bit line, a third MOS transistor having a current path coupled between the current path of said first MOS transistor and ground voltage and a gate coupled to said discharge control signal, and a fourth MOS transistor having a current path coupled between the current path of said second MOS transistor and the ground voltage and a gate coupled to said discharge control signal.

5. The memory device according to claim 4, wherein said column select signal is used as said discharge control signal.

6. The memory device according to claim 1, wherein said memory cell is a static random access memory (SRAM) cell.

7. The memory device according to claim 1, wherein said discharge circuit is coupled to said bit line pair.

8. The memory device according to claim 1, wherein the pair of bit lines includes a first bit line and a second bit line, and wherein said discharge circuit includes:
   a first current drive transistor having a current path coupled to the first bit line, and a control terminal coupled to the second bit line; and
   a second current drive transistor having a current path coupled to the second bit line and a control terminal coupled to the first bit line.

9. The memory device according to claim 8, wherein said discharge circuit further includes:

a first switching transistor having a current path coupled between the current path of the first current drive transistor and a power supply terminal, and a control terminal coupled to receive the column select signal as the discharge control signal; and a second switching transistor having a current path coupled between the current path of the second current drive transistor and the power supply terminal, and a control terminal coupled to receive the column select signal as the discharge control signal.

10. A method of writing data to a memory cell of a semiconductor memory device, the method comprising:

selecting a word line corresponding to a memory cell which is coupled to a pair of bit lines;

coupling the pair of bit lines to a pair of data lines through a column pass gate responsive to a column select signal;

driving the data lines with a write driver, thereby causing a first one of the bit lines to be pulled down to a low voltage level; and discharging current from the first bit line through a discharge circuit.

11. A method according to claim 10, wherein said discharging current includes enabling the discharge circuit responsive to the column select signal.

12. A method according to claim 10, wherein said discharging current includes discharging current from the first bit line responsive to the voltage of the other bit line.

* * * * *